United States Patent
Häfner et al.

(10) Patent No.: US 8,896,364 B2
(45) Date of Patent: Nov. 25, 2014

(54) RELIABILITY IN SEMICONDUCTOR DEVICE CONTROL

(75) Inventors: Jürgen Häfner, Ludvika (SE); Mikael Davidsson, Västerås (SE); Roland Siljeström, Grängesberg (SE); Erika Siljeström, legal representative, Skultuna (SE)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 14/129,015

(22) PCT Filed: Jun. 27, 2011

(86) PCT No.: PCT/EP2011/060720
§ 371 (c)(1),
(2), (4) Date: Mar. 10, 2014

(87) PCT Pub. No.: WO2013/000499
PCT Pub. Date: Jan. 3, 2013

(65) Prior Publication Data
US 2014/0203847 A1    Jul. 24, 2014

(51) Int. Cl.
*H03K 17/687* (2006.01)
*H03K 17/06* (2006.01)
*H03K 17/94* (2006.01)

(52) U.S. Cl.
CPC .............. *H03K 17/941* (2013.01); *H03K 17/06* (2013.01)
USPC ........................................................ 327/427

(58) Field of Classification Search
USPC ........................................................ 327/427
See application file for complete search history.

(56) References Cited

U.S. PATENT DOCUMENTS

| | | | |
|---|---|---|---|
| 5,629,869 A | 5/1997 | Johnson et al. | |
| 5,684,465 A | 11/1997 | Andersson et al. | |
| 5,969,956 A | 10/1999 | Nyberg et al. | |
| 6,084,787 A * | 7/2000 | Nyberg et al. | 363/51 |
| 7,027,896 B2 | 4/2006 | Thompson | |
| 7,239,535 B2 | 7/2007 | Siljeström et al. | |
| 2010/0145537 A1 | 6/2010 | Priebe et al. | |
| 2010/0176850 A1 | 7/2010 | Pereira | |

FOREIGN PATENT DOCUMENTS

| | | |
|---|---|---|
| JP | 59-97227 A | 6/1984 |
| JP | 59-209066 A | 11/1984 |
| JP | 62-131755 A | 6/1987 |
| WO | WO 98/57406 A1 | 12/1998 |
| WO | WO 2009/090143 A1 | 7/2009 |

* cited by examiner

*Primary Examiner* — Daniel Rojas
(74) *Attorney, Agent, or Firm* — Birch, Stewart, Kolasch & Birch, LLP (57) ABSTRACT

A gate control device for a semiconductor device includes at least one power supply module, at least one optical communication interface for receiving optical signals from two valve control units and converting them to electric signals for supply to a corresponding power supply module, where in normal operations mode one valve control unit is an active valve control unit and the other is a standby valve control unit, where the optical signal of an active unit energizes the gate control device and provides semiconductor device controlling data, a semiconductor device control module and a reliability control module that performs selection of active valve control unit.

24 Claims, 3 Drawing Sheets

RELIABILITY IN SEMICONDUCTOR DEVICE CONTROL

FIELD OF INVENTION

The present invention generally relates to the control of semiconductor devices. More particularly the present invention relates to a method for operating a gate control device, a gate control device and a control system for a semiconductor device.

BACKGROUND

Direct Current (DC) power transmission systems are of interest to use in various situations, for instance when transferring electrical power over long distances.

In these systems there has to be provided DC breakers for security measures, for example for being able to break the current in a power line in case of a fault such as a ground fault.

Such a DC breaker will in many cases comprise one or more semiconductor devices, for instance in the form of Insulated Gate Bipolar Transistors (IGBT) being controlled using a gate control device and one or more valve control units.

Furthermore, some DC systems may be provided for covering long distances and may also be provided at high voltages such as above 500 kV, for instance in the range 500-1200 kV. This also means that the DC breaker will be placed at a high potential.

A semiconductor device may here be controlled by a control system comprising a valve control unit and a gate control device. The high potential leads to problems with galvanic isolation of the gate control device in order to be able to operate these high voltages. The isolation would normally require a large transformer, which is both bulky and expensive.

One way of addressing this is through using optical control signals. These optical signals may be provided to the gate control device, which in turn performs the control of the semiconductor devices. In this way the problem of galvanic isolation of the control signal at a high voltage is solved without having to resort to a transformer.

Optical control signals are described in a number of documents.

One example is given in U.S. Pat. No. 7,239,535, which describes a gate control device connected via optical fibres to one central valve control device. The valve control device is also described as being galvanically separated from the gate control device.

JP 62-131755 describes how firing signals from firing signal generators and other signals are combined in a light guide and supplied to a thyristor. The signals in the light guide are also supplied to a light detector of a firing signal switching circuit.

JP 59-209066 describes dual firing devices connected to gate circuits via optical fibres. Each firing circuit is connected to a corresponding gate circuit.

U.S. Pat. No. 5,629,869 describes an intelligent circuit breaker, where a breaker control unit can be redundant and use fibre optic cabling.

These documents thus describe the use of optical fibres for transmitting control signals in relation to the control of a semiconductor device.

However, it may then also be of interest to also use the optical signals for energy supply.

However, in order to be able to do this, laser sources, such as laser diodes, have to be used instead of light emitting diodes (LEDs). Because of the power required the reliability of these laser sources will then also be an issue, which needs to be addressed.

Furthermore, when gate control devices are optically powered from valve control units, the reliability becomes important. The reliability of laser sources in valve control units is typically lower compared to the reliability of LEDs or low power vertical-cavity surface-emitting lasers (VCSELs) used for control of HVDC converters.

Today the maintenance cycles are about one year long. It is therefore of interest to extend these.

The present invention is concerned with addressing the problem of handling reliability in a control system for semiconductor devices employing optical light as both power source and control signal source.

SUMMARY OF THE INVENTION

The present invention is directed towards handling reliability in relation to gate control devices in control systems for semiconductor devices, where a gate control device employs optical light as both power source and control signal source.

One object of the present invention is to provide a method of operating a gate control device for a semiconductor device in a control system for the semiconductor device in order to enhance the reliability of the control system.

This object is according to a first aspect of the present invention achieved through a method for operating a gate control device for a semiconductor device, the gate control device being connected to a first and a second valve control unit, where in normal operations mode one valve control unit is an active valve control unit and the other valve control unit is a standby valve control unit and an active valve control unit provides an optical signal for energizing the gate control device and supplying data for controlling the semiconductor device, the method being performed in the gate control device and comprising the steps of:

receiving a first optical signal from the first valve control unit when being active, receiving a second optical signal from the second valve control unit when being active, performing selection of active valve control unit, and using energy in the first and the second optical signals for powering the gate control device.

Another object of the present invention is to provide a gate control device in a control system for a semiconductor device that enhances the reliability of the control system.

This object is according to a second aspect of the present invention achieved through a gate control device for a semiconductor device comprising:

at least one power supply module, at least one optical communication interface for receiving optical signals from two valve control units, where in normal operations mode of the valve control units one valve control unit is an active valve control unit and the other valve control unit is a standby valve control unit and an active valve control unit provides an optical signal for energizing the gate control device and supplying data for controlling the semiconductor device, said at least one optical interface being further configured to convert an optical signal to an electric signal for supply to a corresponding power supply module powering the gate control device, a semiconductor device control module for controlling the semiconductor device, and a reliability control module configured to perform selection of active valve control unit.

Another object of the present invention is to provide a control system for at least one semiconductor device, which has an enhanced reliability.

This object is according to a third aspect of the present invention achieved through a control system for at least one semiconductor device comprising:
a first valve control unit configured to provide a first optical signal,
a second valve control unit configured to provide a second optical signal,
a first gate control device comprising
   at least one power supply module,
   at least one optical communication interface for receiving said optical signals from said two valve control units, where in normal operations mode of the valve control units one valve control unit is an active valve control unit and the other valve control unit is a standby valve control unit and an active valve control unit provides an optical signal for energizing the gate control device and supplying data for controlling the semiconductor device, said at least one optical interface being further configured to convert an optical signal to an electric signal for supply to a corresponding power supply module powering the gate control device,
   a semiconductor device control module for controlling a first semiconductor device, and
   a reliability control module configured to perform selection of active valve control unit.

The present invention has a number of advantages. Through the gate control device selecting active valve control unit, the need of a central selection function for valve control unit and intercommunication between the two valve control units is omitted. This also simplifies the design of the valve control units.

BRIEF DESCRIPTION OF THE DRAWINGS

The present invention will in the following be described with reference being made to the accompanying drawings, where FIG. 1 schematically shows a DC power transmission system also comprising converters, DC power lines as well as a DC breaker, a gate control device and a local control system, FIG. 2 schematically shows a simplified DC breaker in the DC power transmission system, FIG. 3 schematically shows a part of a control system for a semiconductor device according to a first embodiment of the invention, FIG. 4 schematically shows a flow chart of a method for operating a gate control device in the part of the control system shown in FIG. 3, and FIG. 5 schematically shows a part of a control system for redundant semiconductor devices according to a second embodiment of the invention.

DETAILED DESCRIPTION OF THE INVENTION

In the following, a detailed description of preferred embodiments of the invention will be given.

Figure 1:
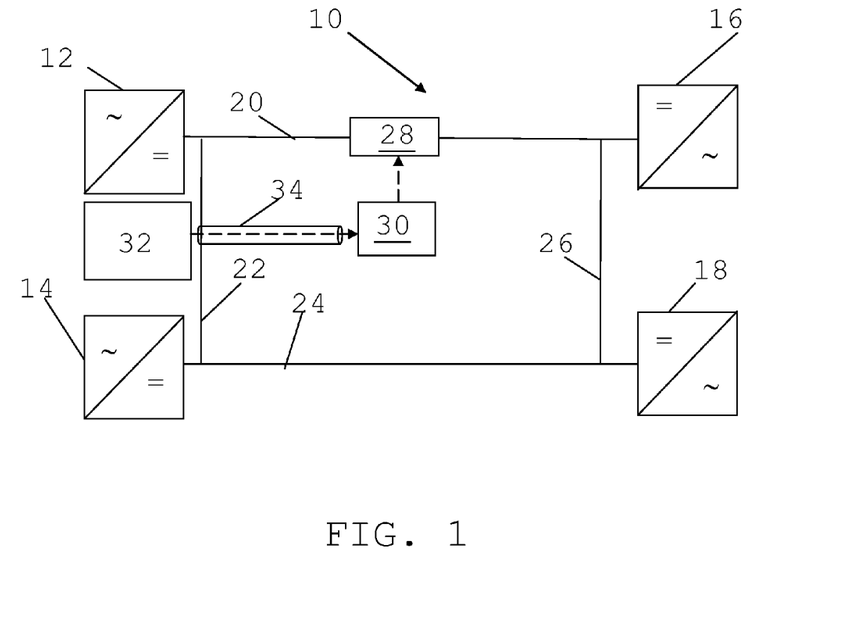

FIG. 1 shows a single line diagram of a simplified Direct Current (DC) power transmission system 10. The power transmission system may with advantage be a High Voltage Direct Current (HVDC) system operating at above 500 kV, for instance in the range 500-1200 kV and with advantage the range of 800-1200 kV. There is here a first converter 12 having an Alternating Current (AC) side for connection to a first AC power line (not shown) and a DC side connected to a first DC power line 20 as well as to a second DC power line 22. The first converter 12 is provided for converting between AC and DC. There is also a second converter 14 converting between AC and DC and having an AC side connected to a second AC power line (not shown) and a DC side connected to the second DC power line 22 as well as to a third DC power line 24. There is also a third converter 16 converting between AC and DC and having an AC side connected to a third AC power line (not shown) and a DC side connected to the first DC power line 20 as well as to a fourth DC power line 26. There is furthermore a fourth converter 18 for converting between AC and DC and having an AC side connected to a fourth AC power line (not shown) and a DC side connected to the third DC power line 24 as well as to the fourth DC power line 26. There is furthermore provided a first circuit breaker 28 in the first power line 20, which circuit breaker 28 includes a first semiconductor device. Finally FIG. 1 shows a local control system 32 placed adjacent the first converter 12 and being connected to a first gate control device 30 for controlling the first semiconductor device of the circuit breaker 28. This connection between the local control system 32 and the first gate control device 30 is furthermore provided through at least one optical fibre 34. The local control system 32 and first gate control device 30 together form a control system for the first semiconductor device in the circuit breaker 28.

The AC power lines may here be provided in different AC power transmission and/or distribution systems. The DC power transmission system 10 may also be termed a DC grid. The converters may here be voltage source converters. However it is also possible with current source converters.

It should here be realized that the DC power transmission system can be more complex and include several more DC power lines, for instance two connected to each converter for providing a bipole system. It can also include less power lines, for instance one. It should furthermore be realized that there may be several more circuit breakers in the DC system. There is only one in FIG. 1 in order to simplify the description of the present invention. If there are more circuit breakers then there will of course be more gate control devices and perhaps also local control systems. There may also be more or fewer converters interfacing the DC power transmission system.

Figure 2:
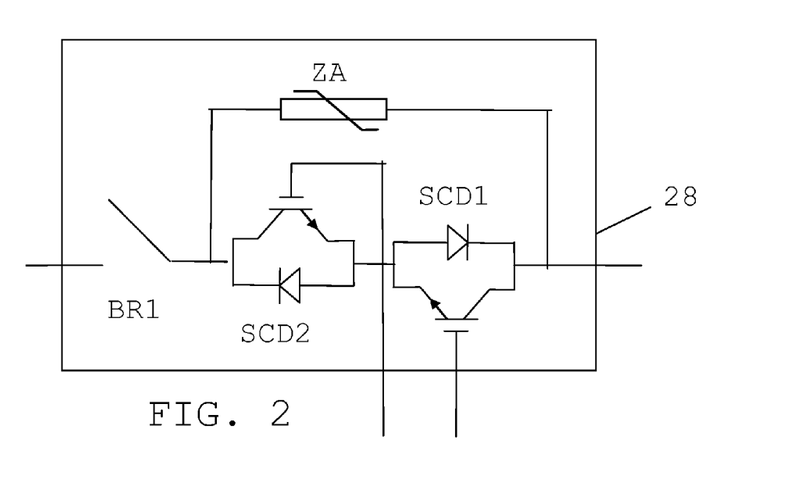

FIG. 2 schematically shows a simplified structure of the circuit breaker 28. It comprises a mechanical breaker element BR1 in series with an electronic breaker element. The mechanical breaker element BR1 may for instance be a relay or a single pole single throw switch. The electronic breaker element is in this example made up of a pair of semiconductor devices, where one is the previously mentioned first semiconductor device SCD1, which in this example is a high-voltage or power semiconductor device, while the other is a second semiconductor device SCD2. Each semiconductor device SCD1 and SCD2 may be an insulated gate bipolar transistor (IGBT) with the source and collector connected in the current path of the DC power line. In this example there is furthermore an anti-parallel diode connected between collector and emitter in order to provide a bypass in the opposite primary current direction. The anode of the diode is here connected to the collector and the cathode to the emitter of the corresponding semiconductor device. As mentioned before the semiconductor device SCD1 and SCD2 have the opposite orientations. This is done in order to be able to block two different primary current directions. This means that here the emitter of the first semiconductor device SCD1 is connected to the emitter of the second semiconductor device SCD2, while the collectors face away from each other. The transistors also each have a gate and this gate is supposed to receive a control signal from a corresponding gate control device, where the first semiconductor device receives a control signal from the first gate control device 30 and the second semiconductor device receives a control signal from another gate control device.

In the circuit breaker 28 there is furthermore an overvoltage protecting element in parallel with the electronic switching element, i.e. in parallel with the two semiconductor devices SCD1 and SCD2 with antiparallel diodes. This element is in this example a surge arrester ZA, like a varistor.

It should here be realized that it is possible and also often common that there are more such power semiconductor devices connected to each other in series in a circuit breaker. All these would then need to receive a corresponding control signal at the gate from a separate gate control device. It should also be realized that an IGBT is merely one example of a high-voltage semiconductor device that can be used in a circuit breaker. Other types that can be use are for instance metal-oxide-semiconductor field-effect transistors (MOSFETs), thyristors, Gate Turn-Off Thyristors (GTOs) and Integrated Gate Commuted Thyristors (IGCTs). Finally it should be realized that the anti-parallel diodes may be omitted. This may for instance be done if the first and second semiconductor devices are two Reverse Conducting Integrated Gate Bipolar Transistors (RC-IGBT) in series with opposite orientation. The anti-parallel diodes may also be omitted if two Reverse Blocking Integrated Gate Bipolar Transistors (RB-IGBT) are connected in antiparallel.

The functioning of such a circuit breaker 28 is that in normal operation of the system, both the mechanical and electronic breaker elements BR1 and SCD1, SCD2 are closed. Then if a fault is detected, such as a ground fault, both will have to be opened. In this case the electronic breaker element SCD1 and SCD2 is first opened, after which it is possible to open the mechanical breaker element BR1.

As mentioned earlier, the DC system 10 is typically operating at high voltage levels, such as 800 kV-1200 kV. At these voltages there is a problem in that gate control devices have to be galvanically isolated for the high voltage levels, which is costly and also problematic. Furthermore, when series connected IGBTs are used, the gate control devices are employed at different voltages.

The present invention solves this problem through providing control signals to the gate control device as optical signals. These optical signals are furthermore also used for energizing the gate control device. This means that the optical signals are converted to electric voltages that are also used as supply voltage of the gate control device. This has the advantage of providing galvanic isolation of the gate control signals from the rest of the system.

In order to be able to do this the light sources of the valve control unit have to be lasers, such as laser diodes. Furthermore, the signals used for controlling the electronic switches, often denoted firing pulses (FP) are furthermore provided at low output power levels of these lasers. This means that no semiconductor device control signal is conveyed at a high output power level. A circuit breaker is only to be switched seldom when there are faults. It is typically switched using a control signal formed through short data bursts. In this way a high power level will be provided most of the time. This also means that a high level will be present often and long enough for enabling powering of the gate control device.

Figure 3:
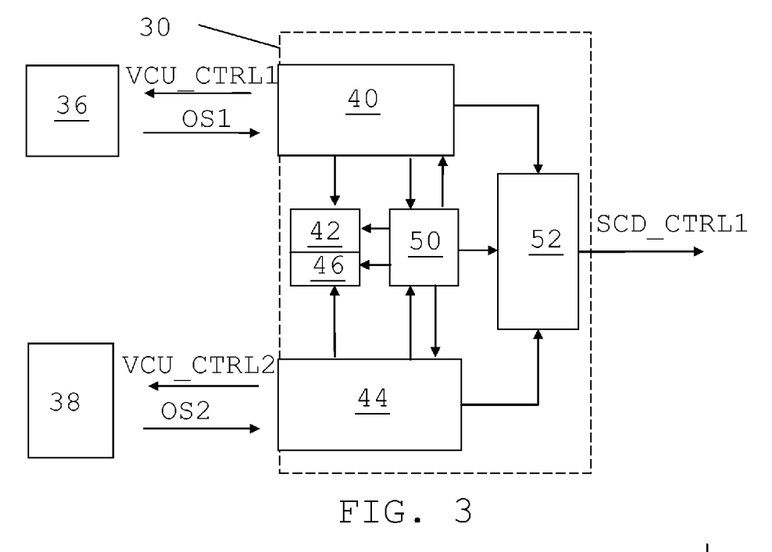

FIG. 3 schematically shows part of the control system for the first semiconductor device SCD1 according to a first embodiment of the invention, and here more particularly shows two valve control units 36 and 38, which are provided in the local control system 32 shown in FIG. 1. These two valve control units 36 and 38 are communicating with the first gate control device 30. The communication is here provided via dedicated optical fibres providing I/O channels and therefore the valve control units 36 and 38 are equipped with optical transmitters for transmitting optical signals and optical receivers for receiving optical signals. A transmitter is here typically a laser, such as a laser diode and the receiver a photo detector such as a photo diode. The combination of optical transmitter and optical receiver may also be considered to be an optical transceiver. For this reason the first gate control device 30 is according to this first embodiment equipped with a first optical interface 40 for communicating with the optical transceiver of the first valve control unit 36. In this first embodiment there is a dedicated optical fibre providing a dedicated I/O channel between the first valve control unit 36 and the first optical interface 40 of the gate control device 30. This first optical communication interface 40 is electrically connected to a first power supply module 42, to a reliability control module 50 and to a semiconductor control module 52. The first optical communication interface 40 also performs opto-electrical conversion in that it on the one hand converts optical signals to electric signals and supplies the power in these electric signals to the first power supply module 42 and on the other hand converts electric signals to optical signals for transfer to the first valve control unit 36 over the dedicated I/O channel. The first optical communication interface is therefore also equipped with an optical transceiver. However, here it is sufficient that the optical transmitter is a light emitting diode (LED). An electric signal generated based on a received optical signal may also be supplied to the reliability control module 50. As mentioned earlier the optical signals include data in the form of firing pulses, which may be forwarded to a semiconductor device control module 52.

The second optical interface 44 of the gate control device 30 is in the same manner connected to the second valve control unit 38 via a second optical fibre providing a dedicated I/O channel between the second valve control unit 38 and the first gate control device 30. The second optical interface 44 also comprises an optical transceiver and is electrically connected to a second power supply module 46, to the reliability control module 50 and to the semiconductor device control module 52. The semiconductor device control module 52 here provides a first control signal SCD_CTRL1 that is applied to the gate of the first semiconductor device SCD1 in the circuit breaker, which signal is thus an electric signal. It may also provide indication pulses that are sent to the valve control unit from which it received firing pulses. Indication pulses are here data related to the control of the first semiconductor device. The reliability control module 50 is in this first embodiment also connected to the first and second power supply modules 42 and 46 as well as to the semiconductor device control module 52.

Figure 4:
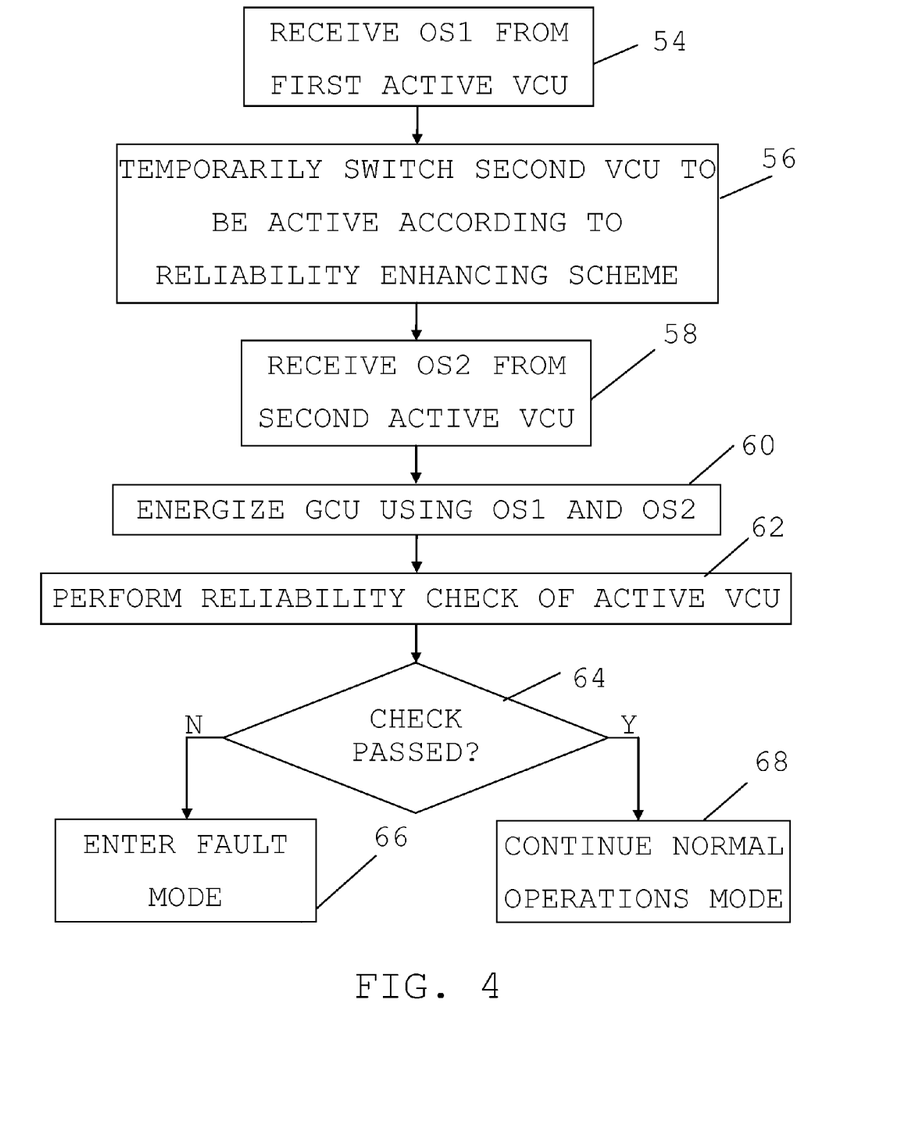

Now the first embodiment of the invention will be described with reference being made also to FIG. 4, which shows a flow chart of a number of method steps in a method for operating a gate control device and being performed in the first gate control device.

A control system for a semiconductor device is typically provided at various hierarchical levels including at least three levels. At the lowest hierarchical level there is provided the gate control device and at a next higher level the valve control units. At an even higher level there is typically provided one or more control computers performing a protection function, for instance because of the detection of a ground fault in a power line. Here the control computer generates a control command that is sent to a valve control unit 36 or 38, which in turn generates a firing pulse based on the control command, which is sent in an optical signal OS1 or OS2 to the gate control device 30. The semiconductor control module 52 in the gate control device 30 then controls a semiconductor device based on the firing pulse with the control signal SCD_CTRL1.

The two valve control units 36 and 38 are provided for redundancy purposes. This means that in a normal operations mode there is always one that is an active valve control unit and another that is a backup valve control unit. This also means that the active valve control unit provides signals, i.e. firing pulses, that are used for controlling a semiconductor device, whereas the standby valve control unit is a standby unit, the signals of which are normally only used to replace the signals of a main valve control unit that is normally active if this main valve control unit becomes faulty in the normal operations mode. In this first embodiment of the invention the first valve control unit 36 is here initially an active valve control unit, while the second valve control unit is a standby valve control unit.

In this first embodiment the first gate control device 30 is continuously and simultaneously, in normal operations mode, supplied with a first optical signal OS1 from the first valve control unit 36 and a second optical signal OS2 from the second valve control unit 38. As can thus be seen the first optical communication interface 40 receives a first optical signal OS1 from the first active valve control unit, step 54, while the second optical interface 44 receives the second optical signal OS2 from the second valve control unit 38. In case there is data, such as firing pulses, intended for the semiconductor control module 52 supplied by the local control system, this would then be provided in the first optical signal OS1 but not in the second optical signal OS2. It is here not possible that firing pulses are present in the optical signal OS2 from the standby valve control unit even though there are such firing pulses present in the first optical signal OS1.

However, in some embodiment of the invention there is always a second optical signal OS2. The optical signals from the valve control units 36 and 38 are according to some embodiments of the invention provided at a certain power level and in this embodiment both are provided at half the maximum output power level of the optical transmitters.

The first optical signal OS1 is thus received by the first optical interface 40, converted into an electric signal and supplied to the first voltage supply module 42, as well as to the reliability control module 50. It may also be provided to the semiconductor control module 52, especially if the signal comprises firing pulses.

In the same way also the second optical signal OS2 is received by the second optical interface 44, converted into an electric signal and supplied to the second voltage supply module 46 and possibly also to the semiconductor control module 52.

Here the reliability control module 50 may control the semiconductor control module 52 to only handle signals from the active valve control unit and disregard or ignore possible signals from the standby valve control unit.

The semiconductor control module 52 would then convert a firing pulse to a gate voltage to be applied to the gate of the semiconductor device and respond to the firing pulse with an indication pulse.

Furthermore, in order to make sure that the active valve control unit is operating satisfactory it may be set or instructed by the reliability control module to regularly send function control data. In one variation of the invention, it may be set to send data at regular intervals that may be distinctly separable from semiconductor device control commands but similar enough for ensuring that switching commands can be sent. This function control data may only be provided for giving proof that the active valve control unit is functioning properly. As an alternative function control data may be a firing pulse, which the gate control device knows to be a "mock" or "fake" firing pulse that is not to be used for controlling the first semiconductor device but only for investigating the functionality of the valve control unit. However, since only the active valve control unit sends such function control data, it is not possible to get the same function control from the redundant valve control unit. This could be a problem in that a redundant standby valve control unit being faulty is provided in parallel with a healthy active valve control unit.

In order to handle this situation and, also, or instead, in order to prolong the life of the active valve control unit, the reliability control module 50 may temporarily switch the second valve control unit 38 to be an active valve control unit according to a reliability enhancing scheme, step 56. The reliability control module 50 may thus generate a command that is delivered to the first optical interface 40, which command is transformed into optical form and transmitted to the first valve control unit 36. This command would then order the first valve control unit 36 to stop being active valve control unit and instead become a backup valve control unit. This command may also include data regarding the length of time that this situation is to be in force. As a response to this command the first valve control unit 36 may then communicate with the second valve control unit 38 in order to switch roles. The first valve control unit 36 may here inform the second valve control unit 38 of the change in status and also about the time duration. As an alternative it is possible that the reliability control module 50 informs the first valve control unit 36 or the second valve control unit 38, when it is time to switch back. As yet another alternative, it is possible that the reliability control module 50 simultaneously sends a first control signal VCU_CTRL1 to the first valve control unit 36 that it is to be a backup valve control unit and a second control signal VCU_CTRL2 to the second valve control unit 38 that it is to become an active valve control unit possibly also with an indication of the time duration. In this latter variation it is possible that instead of informing of the duration, the reliability control module 50 again simultaneously informs the two valve control units 36 and 38 that they are to resume their former roles of active and backup valve control units. In this way it can be seen that the reliability control module of the gate control device performs selections of active valve control unit.

Here the length of time at which the roles are changed, i.e., at which the second valve control unit is to be active, may need to be sufficient in order to receive data, from which the proper function of the second valve control unit can be determined. It is here thus also clear that the second optical signal OS2 including function control data is received from the second valve control unit 38 when being active, step 58.

The reliability handling scheme typically sets out the periodicity of this switching of roles, which may as an example be once every second, once every minute, once every hour or once a day.

The two signals OS1 and OS2 are here used by the first and the second power supply units 42 and 46 for energizing the whole gate control device, step 60. In this embodiment the first optical signal OS1 is used for energizing a part of the gate control device 30 and the second optical signal OS2 is used for energizing another part of the gate control device 30. In this first embodiment the first optical signal OS1 furthermore energizes a first half of the gate control device 30, while the second optical signal OS2 energizes the other half of the gate control device 30.

The reliability control module 50 may furthermore perform a reliability check, step 62. This check may involve the detecting of the optical power levels of the optical signals from the active valve control unit, step 62. For this reason the reliability control module 50 may receive or fetch power level measurements of the optical signal from the optical interfaces. The optical power levels may for instance be compared, in the reliability control module 50, with a reliability threshold, i.e. with a threshold indicating if the valve control unit is functioning properly or not and more particularly if the laser of the valve control unit is functioning properly or not. It is also possible that the function control data is investigated to see if it is correct or not either instead of, or in addition to, the power level check. The function control data may be known by the reliability control module and the check may involve comparing the received function control data with the received function control data. Also the absence of expected function control data may indicate a faulty valve control unit.

If the investigated valve control unit passes the reliability check, like in case the power level is above the threshold or the function control data is present and correct, step 64, then the active valve control unit is functioning properly and therefore normal operations mode is continued, step 68. However, in case the active valve control unit fails the reliability check, step 64, then the reliability control module 50 enters a fault mode, step 66.

This fault mode may comprise the reliability control module 50 ordering the standby valve control unit to take over as active valve control unit and ordering disconnection of the valve control unit that failed the reliability check for the whole duration of the fault mode. The fault mode may typically last until the faulty valve control unit has been replaced.

In this first embodiment this may be combined with the reliability control module 50 connecting the power supply module associated with the healthy valve control unit, i.e. the sole active valve control unit in the fault mode, for supplying power to the whole gate control device, i.e. also to the part originally supplied by the faulty valve control unit.

In this way it can be seen that a gate control device is equipped with two individual optical communication interfaces providing functionality for optical power supply, firing control (FP) and indication pulses (IP). The reliability control module furthermore toggles and controls on a regular basis the optical signals from the two redundant valve control units via the communication channels. This will allow control of individual I/O channels without the need of a central valve control unit and intercommunication controller selecting active valve control unit between the redundant valve control units. This thus means that according to the invention, a determination of switching between valve control units is made at a hierarchical level of the control system below the hierarchical level at which the valve control units are placed and not at a hierarchical level above them as is normally the case. The invention also overcomes the mean time between failures (MTBF) lifetime limitations of the laser driven optical power supply applied to energize the gate control device. The individual control of the I/O channels by the gate control device simplifies the design of the valve control units both concerning hardware and software and thus reduces costs for redundancy. At the end of lifetime of a laser or sudden failure of the I/O channel, sufficient optical power is still supplied by the remaining I/O channel until the next maintenance interval. Immediate trip and repair of the DC Breaker is not required and therefore it is possible to avoid destruction of the semiconductor device that is connected to the gate control device.

One advantage of the first embodiment is that the optical power of both I/O channels is continuously controlled to supply different parts of the gate control device. At the end of life time or sudden failure of one I/O channel, the optical power supply of the remaining I/O channel is then redirected to serve all parts of the gate control device. By avoiding fatal damage of the semiconductor device positions, reliability, maintenance intervals and costs are significantly decreased at the moderate expense of a redundant optical interface for the DC Breaker valve control. By using an output power level that is reduced by 50%, the resulting average laser current and operating temperature of the laser source is strongly reduced. This more than doubles the expected lifetime (MTBF) of the laser sources.

The way the supervision of the laser output power from the valve control units being performed by the gate control units can be performed in a number of ways.

There may be two power levels that are monitored for each valve control unit, a warning level and an alarm level. The warning level may here be used for deciding if a valve control unit is to increase or decrease it's optical output power. This level may thus be used to send power control commands to the valve control units. Information about if the optical input power, i.e. the power supplied from a valve control unit to the gate control unit, is sufficient or not may be sent with sufficient frequency from the gate control unit to the corresponding valve control units. A valve control unit acts on this information and regulates the optical power it outputs accordingly.

The alarm level may on the other hand be used for deciding which valve control unit is to be active. The gate control unit may then send the decisions to the valve control units, which act according to the decisions. There are a number of ways in which this may be done.

In a first variation, a part of the gate control unit is supplied with power obtained via one optical communication interface and another part via the power received via the other optical communication interface. Here only one gate control unit may be active and send control pulses. If the reliability control module detects that the power is below the alarm limit from the active gate control unit, it may send a command to this valve control unit to de-activate itself and at the same time command the other valve control unit to activate itself. At the same time the optical power from the activated valve control unit is used for powering the whole valve control unit.

As an alternative it is possible to modulate the load being connected to the two optical receivers provided through the optical communication interfaces in such a way that the two light sources in the valve control units experience the same load. The modulation may be performed at such a frequency that the optical communication interfaces continuously experience half the load. The control pulses for control of the connected semiconductor device is only sent from one valve control unit that is active. The other only transfers optical power. If in the monitoring of optical input power there is a detection being made that the power from to active valve control unit is below the alarm limit, the gate control unit will send a command to this valve control unit that it should be inactivated. At the same time the gate control unit orders the other valve control unit to be activated.

As yet another alternative it is possible that all the energy required for the gate control unit is obtained via one optical communication interface. The load for the other interface is then completely disconnected. The inactive valve control unit then only sends as much power that is required for the power monitoring to function. If the monitoring of optical power reveals that the power from the active valve control unit is below the alarm level, then the gate control unit orders the this valve control unit to be deactivated and at the same orders the other valve control unit to get activated.

A further alternative is to switch the whole load from one valve control unit to the other valve control unit with low frequency. The switching should be made at such a frequency that it odes not disrupt the communication that takes place between the valve control unit and the gate control unit. The gate control unit decides which valve control unit that is to be active and send both control commands and optical power. If the optical input power to the gate control unit is below the alarm limit this switching is disrupted and only the value control unit that is able to supply enough power is activated.

There are a number of further variations that can be made of the present invention.

The reliability check was above made on an active valve control unit. As long as an optical signal is provided by a standby valve control unit also the power level of this signal can be investigated. This means that the reliability check can also be made on a standby valve control unit.

It should furthermore be realized that the relationship of the power levels can be varied. The backup valve control unit may for instance use an optical signal that has a power level that is a fraction of the power level of the active valve control unit. This fraction may in one embodiment be 25% and in another 10%. The advantage of having a power level at a fraction of the power level of the active valve control unit is that it is possible to investigate the standby valve control unit, while at the same time even further prolonging the time in which the system may be run before the faulty valve control unit has to be replaced.

As yet another alternative it is possible that the light source of a standby valve control unit is turned-off, which saves energy and prolongs the life of the standby valve control unit even further. However, in this case it is not possible to investigate a standby valve control unit until it becomes active. In this case both optical signals will also be used for energizing the whole gate control device.

As another variation of the invention it is possible that each optical interface is equipped with an electrical storage capacitor. In this variation of the invention the reliability control module may control both the valve control units to be simultaneously active in a start-up mode, i.e. even if the light source of a stand-by valve control is later to be turned off completely in normal operations mode. Here they may initially also be operated at maximum output power. This means that during initial startup both I/O channels may be utilized for powering the gate control device. This reduces the startup time of the gate control device. The individual capacitive energy storages here allow safe toggling between the channels without risk of power interruption for common gate control device functions.

Each valve control unit may furthermore be equipped with a laser control status table, in which laser current setting data is stored. As a laser of a certain valve control unit is started to be used the final laser current value after finishing calibration is stored in the laser control status table of this valve control unit, which value is then immediately used when later starting to use this laser after having been turned off. The table value of the other gate control device having an non-calibrated laser, may then receive the final laser current value of the calibrated laser.

This speeds up the calibration process of the later started laser. The value in question may be transferred directly between the valve control units. As an alternative it may be transferred from one valve control unit to the gate control device, which then forwards it to the other valve control unit.

In another variation both valve control units may be provided on the same circuit board. They may thus placed on a common valve control unit I/O board. This also means that they may employ the same I/O channel to the gate control device, why the second optical interface may be removed from the gate control device. This also reduces the number of fibers by at least 25%.

Figure 5:
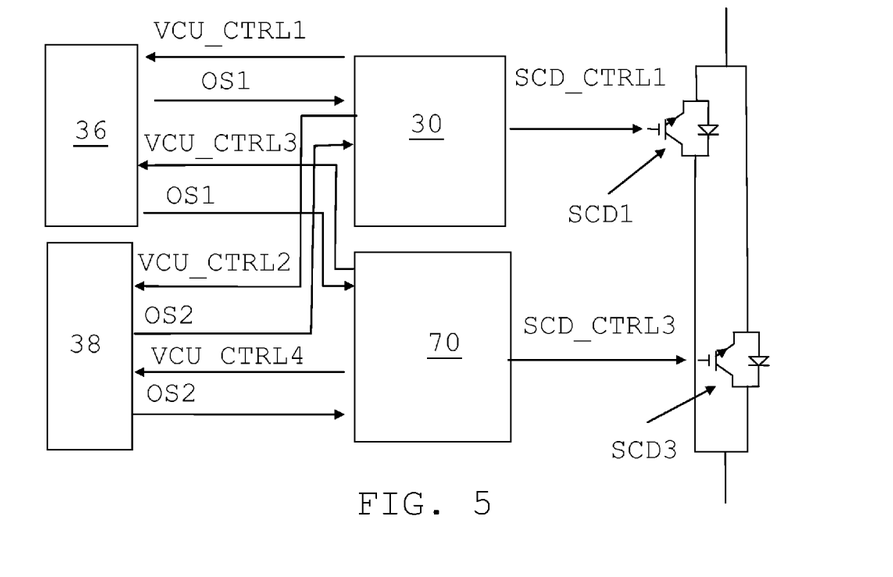

In another variation of the invention complete parallel redundancy is realized for the first gate control device and first semiconductor device. This will allow to bypass a failed semiconductor device in order to prevent immediate trip and repair of the DC Breaker. This situation is schematically shown in FIG. 5.

As before there is a first and second valve control unit 36 and 38 communicating with a first gate control device 30, which in turn controls a first semiconductor device SCD1. However in this variation there is a second parallel gate control device 70 controlling a third further semiconductor device SCD3, which third semiconductor device SCD3 is connected in parallel with the first semiconductor device SCD1. Here it should also realized that each of the depicted semiconductor devices would normally be connected in series with a semiconductor device with opposite orientation just as in FIG. 2. However, these have here been omitted in order to no obscure the invention with unnecessary details. Here the first and second valve control units 36 and 38 also communicate with the second gate control device 70. This means that they both send their optical signals OS1 and OS2 also to this second gate control device 70 as well as receive control signals VCU_CTRL3 and VCU_CTRL4 from this second gate control device 70. This second gate control device 70 will have the same functionality as the first gate control device 30.

There are many variations that may be made of the invention apart from those already mentioned. It is possible that the reliability check is omitted. As an alternative it is possible that the temporary switching of active valve control units is omitted. However one of these functions should be performed by the gate control device. The invention is not limited to DC systems but may be used in any power transmission or power distribution system. It is also possible that a semiconductor device is used in another field than in a circuit breaker. It may for instance be used in a converter or in a STATCOM.

From the foregoing discussion it is evident that the present invention can be varied in a multitude of ways. It shall consequently be realized that the present invention is only to be limited by the following claims.

The invention claimed is:

1. A method for operating a gate control device for a semiconductor device, the gate control device being connected to a first and a second valve control unit, where in normal operations mode one valve control unit is an active valve control unit and the other valve control unit is a standby valve control unit and the active valve control unit provides an optical signal for energizing the gate control device and supplying data for controlling the semiconductor device, the method being performed in the gate control device and comprising the steps of:

receiving a first optical signal from the first valve control unit when being active, receiving a second optical signal from the second valve control unit performing selection of active valve control unit, and using energy in the first and the second optical signals for powering the gate control device.

2. A method according to claim 1, wherein the performing of selection of active valve control unit comprises temporarily switching, according to a reliability enhancing scheme applied in normal operations mode, from the first valve control unit being active to the second valve control unit being active.

3. The method according to claim 1, wherein the performing of selection of active valve control unit comprises performing a reliability check of one of the valve control units, and entering a fault mode based on the result of said reliability check, wherein the fault mode comprises selecting the other valve control unit to be the sole active valve control unit for the duration of the fault mode.

4. The method according to claim 3, wherein the reliability check comprises detecting the power level of an optical signal from the investigated valve control unit and comparing the power level with a reliability threshold and the entering of the fault mode is made if said power level fails to reach said reliability threshold.

5. The method according to claim 1, wherein the light source of a standby valve control unit is turned off.

6. A method according to claim 1, wherein a standby valve control unit provides an optical signal with a power level that is related to the power level of the active valve control unit.

7. A method according to claim 6, wherein the power level of the standby valve control unit is a fraction of the power level of the active valve control unit.

8. A method according to claim 6, wherein the power level of the standby valve control unit is the same as the power level of the active valve control unit.

9. A method according to claim 8, wherein the first and second valve control units have power levels that are half the maximum power levels of their light sources.

10. A method according to claim 5, wherein the first valve control unit energizes a first part of the gate control device and the second valve control unit energizes a second part of the gate control device.

11. A method according to claim 1, wherein data in an optical signal is provided as low power levels of the signal.

12. A method according to claim 1, further comprising controlling the first and the second valve control unit to be active simultaneously in a start-up mode.

13. A gate control device for a semiconductor device comprising:
   at least one power supply module,
   at least one optical communication interface for receiving optical signals from two valve control units, where in normal operations mode of the valve control units one valve control unit is an active valve control unit and the other valve control unit is a standby valve control unit and an active valve control unit provides an optical signal for energizing the gate control device and supplying data for controlling the semiconductor device, said at least one optical interface being further configured to convert an optical signal to an electric signal for supply to a corresponding power supply module powering the gate control device,
   a semiconductor device control module for controlling the semiconductor device, and
   a reliability control module configured to perform selection of active valve control unit.

14. The gate control device according to claim 13, wherein the reliability control module, when being configured to perform selection of active valve control unit, is further configured to temporarily switch, via said at least one optical communication interface, according to a reliability enhancing scheme applied in a normal operations mode, from the first valve control unit being active to the second valve control unit being active.

15. The gate control device according to claim 13, wherein the reliability control module, when being configured to perform selection of active valve control unit, is further configured to perform a reliability check of one of the valve control units and enter a fault mode based on the results of the reliability check, wherein in the fault mode the reliability control module is further configured to select the other valve control unit to be the sole active valve control unit for the duration of the fault mode.

16. The gate control device according to claim 15, wherein the reliability control module when performing a reliability check is configured to detect the power level of an optical signal from the investigated valve control unit and compare the power level with a reliability threshold and when entering the fault mode is configured to enter the fault mode if the power level fails to reach said reliability threshold.

17. The gate control device according to claim 13, wherein a standby valve control unit provides an optical signal with a power level that is related to the power level of the active valve control unit.

18. The gate control device according to claim 17, wherein there is a first and second optical communication interface and a first and a second power supply module, where the first optical communication interface is connected to the first power supply module for allowing the first valve control unit to energize a first part of the gate control device and the second optical communication interface is connected to the second power supply module for allowing the second valve control unit to energize a second part of the gate control device.

19. The gate control device according to claim 18, wherein each optical communication interface is equipped with an electrical storage capacitor.

20. The gate control device according to claim 13, wherein the reliability control module is further configured to keep both valve control units active in a start-up mode.

21. A control system for at least one semiconductor device comprising:
   a first valve control unit configured to provide a first optical signal,
   a second valve control unit configured to provide a second optical signal,
   a first gate control device comprising
      at least one power supply module,
      at least one optical communication interface for receiving said optical signals from said two valve control units, where in normal operations mode of the valve control units one valve control unit is an active valve control unit and the other valve control unit is a standby valve control unit and the active valve control unit provides an optical signal for energizing the gate control device and supplying data for controlling the semiconductor device, said at least one optical interface being further configured to convert an optical signal to an electric signal for supply to a corresponding power supply module powering the gate control device,
      a semiconductor device control module for controlling a first semiconductor device, and
      a reliability control module configured to perform selection of active valve control unit.

22. The control system according to claim 21, wherein each valve control unit is equipped with a laser control status table, where the laser control status table of one valve control unit is updated by a calibrated laser current value from the other valve control unit.

23. The control system according to claim 21, wherein the first and second valve control units are placed on the same circuit board.

24. The control system according to claim 21, further comprising a redundant second gate control device in parallel with the first gate control device and a further semiconductor device in parallel with said first semiconductor device, where said further semiconductor device is connected to the second redundant gate control device.

* * * * *